United States Patent [19]

Minemura et al.

[11] Patent Number: 4,950,173

[45] Date of Patent: Aug. 21, 1990

[54] SERVICE TEMPERATURE CONNECTOR AND PACKAGING STRUCTURE OF SEMICONDUCTOR DEVICE EMPLOYING THE SAME

[75] Inventors: Tetsuro Minemura; Hisashi Ando, both of Hitachi; Yoshiaki Kita, Katsuta; Isao Ikuta, Iwaki, all of Japan

[73] Assignee: Hitachi, Ltd., Tokyo, Japan

[21] Appl. No.: 843,004

[22] Filed: Mar. 24, 1986

Related U.S. Application Data

[63] Continuation of Ser. No. 619,943, Jun. 11, 1984, abandoned.

[30] Foreign Application Priority Data

Jun. 15, 1983 [JP] Japan ................................. 58-105652

[51] Int. Cl.[5] ............................................. H01R 9/09
[52] U.S. Cl. ......................................... 439/82; 439/74; 439/161; 439/342
[58] Field of Search ................. 339/30, DIG. 1, 17 R, 339/17 C, 17 E; 174/DIG. 8; 361/406; 200/268, 269; 439/55, 81, 82, 78, 161, 342, 74

[56] References Cited

U.S. PATENT DOCUMENTS

| | | | |
|---|---|---|---|
| 3,619,478 | 11/1971 | Staiger | 339/17 C |
| 3,670,409 | 6/1972 | Reimer | 339/17 B |
| 4,138,604 | 2/1979 | Harmsen et al. | 200/268 |
| 4,487,465 | 12/1984 | Cherian | 339/30 |

FOREIGN PATENT DOCUMENTS

| | | |
|---|---|---|
| 57-185680 | 11/1982 | Japan . |
| 58-71572 | 4/1983 | Japan . |
| 58-73973 | 5/1983 | Japan . |
| 2095480 | 9/1982 | United Kingdom ................. 339/30 |

OTHER PUBLICATIONS

IBM Bulletin, Roche et al, vol. 6, No. 8, p. 87, 1-1964.
IBM Bulletin, Skinner, vol. 12, No. 3, p. 467, 8-1969.
IBM Bulletin, Hoffman et al, vol. 13, No. 9, p. 2475, 2-1971.
IBM Bulletin, Hinkley et al, vol. 9, No. 7, p. 766, 12-1966.
IBM Bulletin, Kryzaniwsky, vol. 14, No. 9, p. 2599, 2-1972.

Primary Examiner—Neil Abrams
Attorney, Agent, or Firm—Antonelli, Terry, Stout & Kraus

[57] ABSTRACT

The present invention discloses a connector comprising: an insulating substrate having a plurality of through-holes and having a desired first circuit pattern formed on the substrate; female contactors each being formed and fixed around the edge of the through-hole and having an opening, an edge of which extends inwardly of the through-hole, said female contactors being electrically connected to said first pattern; and a male contactor comprising an insulating substrate having a desired second circuit pattern thereon and a plurality of male contactor pins fixed to the substrate and electrically connected to said second pattern, said pins each being located in a position corresponding to each of the openings of said female contactors, wherein said female contactors are made of a thin film of a shape memory alloy and the edge of each of the female contactors is given, before inserting each of the male contactor pins, such a shape memory that the contactor is returned to a position to close the opening when said contactor is subjected to a temperature above the martensitic transition temperature.

12 Claims, 5 Drawing Sheets

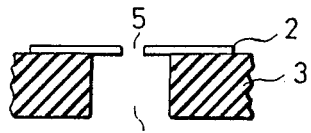
FIG. 2(a)
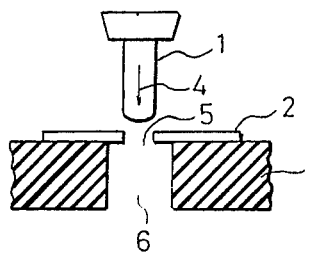
FIG. 1(a)
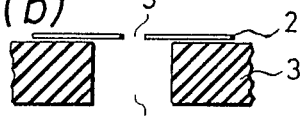
FIG. 2(b)
FIG. 2(c)
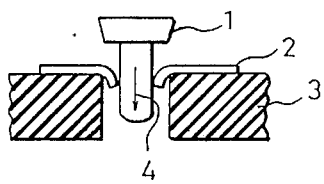
FIG. 1(b)
FIG. 2(d)
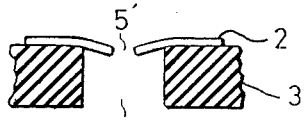
FIG. 3(a)
FIG. 3(b)
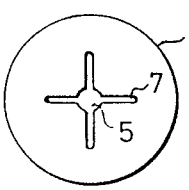 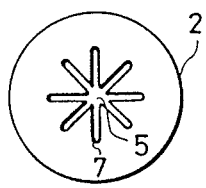
FIG. 4(a)   FIG. 4(b)
FIG. 3(c)
FIG. 3(d)
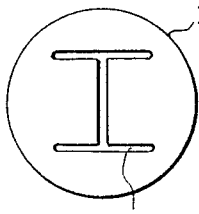 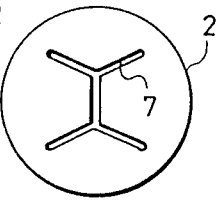
FIG. 4(c)   FIG. 4(d)
FIG. 3(e)

SERVICE TEMPERATURE CONNECTOR AND PACKAGING STRUCTURE OF SEMICONDUCTOR DEVICE EMPLOYING THE SAME

This is a continuation of application Ser. No. 619,943, filed June 11, 1984 now abandoned.

BACKGROUND OF THE INVENTION:

The present invention relates to an electronic connector and the packaging structure of a semiconductor device (LSI) for employing the same.

A pin connector includes a pin, a socket for receiving the pin, and a packaging portion, with the pin connector being extensively used as an electric or electronic connection component. With enhancement in a density of a computer, the importance of the connectors is being re-recognized as one of the packaging techniques, and a conventional pin connector includes a socket portion of a spring member, principally made of a Cu-Be alloy, with a pin to be inserted being connected by a spring force of the socket portion. The socket portion is arranged in parallel with a direction of insertion of the pin, and the pin is held between the springy parts of the spring member (or in the cylinder thereof). Recently, with enhancements in the packaging densities of electric and electronic components and the density of a computer, it has been necessary to compact and miniaturize the connectors. All of the conventional socket shapes pose a serious problem when attempting to compact and miniaturize the same, since the socket includes a cylindrical spring member and a certain height is needed in the pin inserting direction, with the wall of a socket package increasing in thickness. Additionally, since the socket shape is complicated, manufacturing is difficult in case of the miniaturization of the connector, and hence, the shape needs to be simplified. On the other hand, the enhanced density of a computer leads to increase in the number of pins of the connector and, since the number of pins to be inserted increases, a force for inserting the pins into the socket increases. With the large number of pins, the manufacturing of the connector, based on the spring force of the socket, becomes difficult. It has therefore been proposed to develop a low or zero insertion force connector in which pins can be inserted or drawn out by a small force while nevertheless ensuring a reliable connection in the joined state.

In, for example, Japanese Laid-Open Patent Application No. 57-185680, a connector is proposed wherein a hole is provided in the central part of a flat spring member, and a male contactor is inserted in the hole. One disadvantage of this proposed construction resides in the fact that it is very difficult to draw out the male contact.

In, for example, Japanese Laid-Open Patent Application No. 58-17572 or 58-73973, an electric connector for a Josephson element semiconductor device is proposed, which is operated at a very low temperature by the deformation of a bimetal with a temperature change. However, a disadvantage of these proposals resides in the fact that with an electric connector employing the bimetal only a relatively large bimetallic element can cause a sufficient deformation thereby making it difficult for the connector to be miniaturized.

An electric connector wherein the cylindrical socket is made of a shape memory alloy is proposed in 'Kinzoku Binran (Handbook of Metals)' (fourth revised edition, December 1982); however, this proposed connector cannot be miniaturized.

An object of the present invention is to provide a connector in which male contacts can be inserted and drawn out with low forces, and the packaging structure of a semiconductor device employing the connector.

The present invention includes a connector comprising an insulating substrate having a plurality of through-holes and a desired first circuit pattern formed on the substrate. Female contacts are each formed and fixed around the edge of the through-hole and have an opening, with an edge thereof extending inwardly of the through-hole. The female contacts are electrically connected to the first pattern, and a male contact includes an insulating substrate having a desired second circuit pattern thereon, with a plurality of male contact pins being fixed to the substrate and electrically connected to the second pattern. The pins are each located in a position corresponding to each of the openings of the female contacts, and the female contacts are made of a thin film of a shape memory alloy and an edge of each of the female contacts is given, prior to insertion of each of the male contact pins, such a shape memory that the contact is returned to a position to close the opening when the contact is subjected to a temperature above the martensitic transition temperature.

Additionally, in accordance with the present invention, a part of a female contact forming a hole is provided with a slit so as to be adapted for a bending deformation due to an insertion of a male contact and has a shape memory so as to be adapted for the bending deformation in the same direction as that of the insertion of the male contact, whereupon the female contact is brought into contact with the male contact.

Generally known as shape memory alloys are a Cu alloy containing 0–10wt% of Al and 10–40wt% of Zn, a Cu alloy containing 23–26wt% of Sn, a Cu alloy containing 12–15wt% of Al and 3–5 wt% of Ni, an alloy consisting of 42–48wt% of Ti and a balance of Ni, and so forth. Besides, an Fe-Mn system, an Fe-Cr-Ni system, a U-Mo system, an Mn-Cu system, an Au-Cd system, etc. are usable.

The following table lists, for example, the compositions (weight %) and characteristics of Cu-Al-Ni alloy and the Ni-Ti alloy. Since each of these alloys can memorize the final shape at temperatures below the $M_f$ point and the final shape at temperatures above the $F_f$ point, it undergoes the cycles of the final shapes when subjected to these temperature cycles. It may accordingly be subjected to the shape memory so that a male contact and female contact may be in contact and electric conduction with each other in desired parts in a service temperature condition.

TABLE

| Characteristics/ Compositions | Cu - 14.0% Al - 4.0% Ni | Ni - 44.3% Ti |
|---|---|---|
| Transformation temperature (°C.) | | |
| $M_s$ | −124 | −23 |
| $M_f$ | −140 | −41 |
| $A_s$ | −117 | −12 |

TABLE-continued

| Characteristics/Compositions | Cu - 14.0% Al - 4.0% Ni | Ni - 44.3% Ti |
| --- | --- | --- |
| $A_f$ | −71 | 3 |
| Electric resistance ($\mu\Omega \cdot$ cm) | 11 | 70 |
| Rupture strength (kg/mm$^2$) | 40 | 60 |

$M_s$: Parent phase → martensitic transformation starting temperature
$M_f$: Martensitic transformation finishing temperature
$A_s$: Martensite → parent phase transformation starting temperature
$A_f$: Parent phase transformation finishing temperature The female contact of the present invention is a flat thin film, with the thickness of the thin film being preferably 100μm or less.

In the female contact of the present invention, the part forming the hole is preferably subjected to the shape memory so as to be capable of bending deformation in the direction in which the female contact comes into contact with the male contact, when changed to the parent phase transformation temperature of the shape memory alloy. Further, the connector of the present invention is preferably such that the male contact is inserted in the hole in a low temperature condition below the martensitic transformation temperature of the shape memory alloy, whereupon the connector has its temperature raised to the parent phase transformation temperature of the alloy so as to be returned into the original shape memorized. Since the male contact is inserted under the soft martensite state of the female contact, the insertion is permitted by a low insertion force, while during the service, the female contactor returns into the original state to afford a rigid connection.

In the present invention, preferably the part of the female contact, forming the hole, is subjected to the shape memory so as to form a space larger than the occupying space of the male contact in the contact part in the temperature condition lower than the martensitic transformation temperature of the shape memory alloy, the male contact being inserted in that state, whereupon the female contact has its temperature raised to above the parent phase transformation temperature of the alloy so as to return into its original shape. Since the male contact is inserted with the hole of the female contact expanded, the insertion is permitted by the zero insertion force, while, during the service of the connector, the contacts are rigidly connected as described above.

The hole portion of the female contact in the present invention is provided, in a portion adapted to contact with the male contact, with a slit or opening which is narrower than a space to be occupied by the male contact or with a slit which communicates with the hole portion. That is, a slit has a substantially H shape, with at least two slits being formed at equal intervals in the central part of the female contact, or that two or more slits are provided at the center of the circle. Further, it is favorable that the hole part is smaller than the occupying space of the male contact in the male contact area with this male contact. Likewise to the foregoing, the male contact is inserted into the female contact at a temperature below the martensitic transformation temperature, whereupon the female contact has its temperature raised to above the parent phase transformation temperature in the service temperature condition, to thereby afford the rigid connection.

Further, insulating substrates are arranged on the top face and bottom face of the female contact and are fastened to each other. With this connector, increase in the number of pins can be realized at a higher density, and miniaturization is also possible. Although the number of pins is 100-200 in LSI package for the present-day computer, it is anticipated to become 1000-2000 for a substrate of 10 cm square in the future. The present invention can cope with even such a number of pins. Further, according to the present invention, female contacts of a shape memory alloy can be disposed on the upper and lower surfaces of an insulating substrate similarly to the foregoing. When the female contact is disposed on one surface of the insulating substrate, the male contact is disposed on the opposite surface. The female contacts, or the female contact and male contact are electrically connected to each other.

As the insulating substrate, a multi-layer print-wired substrate or printed circuit board is used. In correspondence with the holes for inserting the male contacts, the female contacts of the shape memory alloy according to the present invention can be disposed in electrical connection.

The female contact of the present invention can be fabricated of only a shape memory alloy in the form of a thin film. Further it can be fabricated of a composite member in which thin metal film are deposited and adhered and in which at least one of the thin metal films is made of a shape memory alloy.

It is very difficult to plastically work a bulky shape memory alloy into a thin film. In contrast, the thin film, having a thickness of not greater than 0.1mm, can be formed by an evaporation method on a metal substrate or by pouring the molten metal on the peripheral surface of a rapidly rotating roll, for quenching and solidification. When the molten metal is poured on the mirror-finished surface of a roll having a thermal conductivity of at least 0.1 cal/cm.sec.° C. at the room temperature, the cooling rate of the molten metal until the solidification can be set at or above $10^3$° C./sec Thus, the alloy of very fine crystal grains is produced and can be plastically deformed, so that it can be worked even into a complicated shape. In order to form the thin film by a vapor process such as evaporation, the shape memory alloy needs to be formed in correspondence with holes which are provided in an insulating substrate. In this case, a metal foil is disposed on the insulating substrate in advance, and the shape memory alloy is deposited thereon. The alloy can be formed into a predetermined plane shape in correspondence with the holes of the insulating substrate, preferably by etching.

According to the present invention, a shape memory alloy is quenched from a vapor phase or liquid phase and is solidified on another metal member (substrate), whereby a composite member exhibiting the shape memory effect and having the characteristics of the substrate (or a different phase) can be produced along with the substrate or the different phase which has already been solidified on the substrate. As methods for quenching and solidification from the vapor phase or liquid phase, there are physical evaporation, chemical evaporation, molten metal quenching, flame spraying, etc. Concretely, the physical evaporation includes a general evaporation process, a sputtering process, an ion plating process, etc. The chemical evaporation is a solidifying process which is based on a chemical reaction in a gaseous state. Additionally, in the molten metal quenching method a metal alloy, in its molten state, is poured onto a substrate so as to cool it by contact with the substrate, and it is generally known as a process for producing an amorphous alloy. In particular, single-roll and two-roll methods etc. are known for manufacturing a thin strip and a fine wire by pouring the molten metal onto the surface of the roll which rotates at a high speed. In a flame spraying method, alloy powder, in its molten state, is atomized and solidified on a substrate. According to any of these methods, the alloy layer solidified on the substrate attains a good adhesion with the substrate or another metal which has already solidified on the substrate. Further, the crystal grains of the layer are rendered very fine due to the quenching and solidification. Thus, the stress concentration on a grain boundary due to a deformation is moderated by the fineness of the crystal grains, and the ductility of the shape memory alloy, which has been somewhat less ductile due to the coarsening of crystal grains, can be improved. Further, when a material which is higher in ductility than the shape memory alloy is used as the substrate, the fragility of the shape memory alloy can be compensated. Besides, when a material having a proper elasticity is selected for the substrate and is compounded with the shape memory alloy, the resultant substrate can be utilized as a spring member, and it is possible to control a temperature, a force etc. or with which the shape memory effect appears.

Any of the shape memory alloys is a multi-element alloy, and is therefore inferior to a pure metal in conductivity. According to the present invention, however, the shape memory alloy can be compounded along with a substrate of high conductivity such as Cu, Al, Au or Ag, so that a shape memory compound member of favorable conductivity can be fabricated.

The present invention also relates to a packaging structure for a semiconductor device wherein a multi-layer print-wired substrate, on which the semiconductor device is mounted, is connected to a connector, and the connector is then mounted on a printed circuit board, with the connector being made of a shape memory alloy having a plurality of holes which are provided in correspondence with a plurality of male contacts disposed in the multi-layer print-wired substrate as described above.

In accordance with the present invention, a packaging structure for a semiconductor device is provided having a multi-layer print-wired substrate on which the semiconductor device is mounted, and a printed circuit board on which the substrate is mounted, with the printed circuit board being provided with a female contact made of a shape memory alloy having a plurality of holes which are provided in correspondence with a plurality of male contacts disposed in the multi-layer print-wired substrate. Additionally, the present invention provides a packaging structure for a semiconductor device having a multi-layer print-wired substrate on which the semiconductor device is mounted, and a printed circuit board on which the substrate is mounted, with a multi-layer print-wired substrate being provided with a female contact made of a shape memory alloy having a plurality of holes which are provided in correspondence with a plurality of male contacts disposed in the semiconductor device.

The female contact of the present invention provided in the connector, the printed circuit board or the multi-layer print-wired substrate can be joined with the male contacts electrically and mechanically securely without soldering.

BRIEF DESCRIPTION OF THE DRAWINGS:

FIGS. 1(a) and 1(b) are sectional views illustrative of the connection situation of a connector according to the present invention;

FIGS. 2(a)-2(d) are sectional views illustrative of the connection situation of the connector of the present invention utilizing the unidirectional shape memory effect;

FIGS. 3(a)-3(e) are sectional views illustrative of the connection situation of the connector of the present invention utilizing a bi-directional shape memory effect;

FIGS. 4(a)-4(d) are plan views of female contacts in accordance with the present invention;

DETAILED DESCRIPTION

Figure 5A:
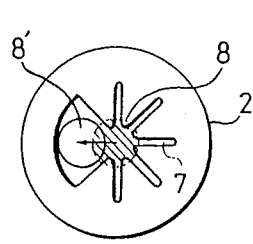
FIGS. 5(a)-5(b) are plan views illustrative of female contacts in other examples of the present invention and the situation of the insertion and withdrawal of the male contacts.

Referring now to the drawings wherein like reference numerals are used throughout the various views to designate like parts and, more particularly, to FIG. 1, according to this figure, an electric connector includes a pin 1, forming a male contact adapted to be inserted in the direction 4 of a thickness of a female contact, with the female contact 2 having a flat shape, and being of a relatively thin thickness. The electric connector has a small height and is compact and may be molded in an easy manufacturing process. The female contact 2, formed as a thin plate or thin film of a shape memory alloy, is arranged orthogonally to the direction 4 of insertion of the pin 1 into a pin inserting hole 6 of an insulating substrate 3. A pin inserting hole portion 5 of the female contact 2, formed on the pin inserting hole 6 of the insulating substrate 3 is formed with a vacant space such as a slit, and the pin 1 is inserted into the pin inserting hole portion 5 and pin inserting hole 6. The female contact is subjected to shape memory so that the joining force of the pin 1 may act due to a spring force at above a parent phase transformation temperature or below a martensitic transformation temperature. The pin 1 is inserted into the pin inserting hole portion 5 of the female contact 2. This structure can reduce the wall thickness as compared with the prior art, and is effective for the compaction of the connector. Further, since the female contact 2 is disposed on the insulating substrate 3 in planar fashion, it can be produced and unitarily formed on the substrate 3 by a method in which it is formed directly from a vapor phase or liquid phase, such as the PVD process (evaporation, sputtering, etc.), CVD process, a molten-metal quenching process or flame spraying. The thin plate or thin film forming the female contact 2 is bonded or formed, and can be unitarily formed in a predetermined shape by photolithography, chemical etching or the like. The above merits are very effective for the miniaturization of the connector because a multi-pin joining portion in a multi-pin connector can be formed at a time, and very fine working is also easy.

When a shape memory alloy, based on the terminally elastic type martensitic transformation, is applied to the female contact 2 in the connector structure of the present invention, the following effect is achieved. As shape memory alloys, Cu-Al-Zn, Cu-Al-Ni and Ti-Ni alloys are generally known, but all represent materials that are difficult in working such as rolling and forming. FIGS. 2(a)-2(d) and FIGS. 3(a)-3(d) provide an example of the steps of the joining processes of connectors in each of which a shape memory alloy is formed on an insulating substrate 3. It is known that the shape memory effect has several types and, for example, FIGS. 2(a)-2(d) exploit the unidirectional shape memory effect, with FIGS. 3(a) and 3(b) exploiting a bi-directional shape memory effect. In either case, a shape memory alloy whose martensitic transformation temperature is below the operating temperature of the connector, (in general, the room temperature) is used. In FIG. 2(a), a female contact 2, made of the shape memory alloy memorizes a flat state at the operating temperature, while in FIG. 2(b), it has its temperature lowered to below the martensitic transformation temperature. In this state, the alloy undergoes the martensitic transformation, and hence, it becomes very soft though the shape does not change. In FIG. 2(c), a pin 1 is inserted under the soft state. When the operating temperature is restored in FIG. 2(d), the martensite returns to the original parent phase. Accordingly, the alloy hardens, and a force to restore the original shape (FIG. 2(a)) acts owing to the shape memory effect. Accordingly, a great joining force is imparted to the inserted pin 1. In view of these results, when the shape memory effect is utilized, a pin connector of low insertion force can be realized.

FIGS. 3(a)-3(d) exploits a reversible shape memory conforming to the transformation as shown in FIGS. 3(a) and 3(b). The shape memory is so made that the state in FIG. 3(a) is established in the operating temperature condition of the connector and that the state in FIG. 3(b) is established at or below the martensitic transformation temperature. When the connector is cooled to the martensitic transformation temperature, the gap of a pin inserting hole part 5', especially formed in the shape of a slit, is opened by the shape memory effect. The pin 1 is inserted therein as shown in FIG. 3(c). When the operating temperature condition is restored as shown in FIG. 3(d), the alloy returns into the parent phase state due to the shape memory effect, to become hard and return into the FIG. 3(a) state, so that the female contacts 2 and the pin 1 are loaded with a joining force. As illustrated in FIG. 3(e), when the joined connector is cooled to the condition of or below the martensitic transformation temperature again, the pin inserting hole part open and the pin 1 can be readily withdrawn. In this manner, when the bi-directional shape memory effect is applied to the connector structure of the present invention, an electric connector of substantially zero inserting and withdrawal forces can be realized. The working of the shape memory alloy is generally difficult and the female contact 2 of the prior art has a cylindrical or socket shape so that the working of such a female contact 2 of a shape memory alloy is very difficult because of the complicated shape. In contrast, the structure of the female contact 2 of the present invention is of a flat shape so that the application of the shape memorizing alloy to the female contact 2 of the present invention is easy.

The working of the shapes of females contacts was studied. A spring material of a Cu-Be alloy and having a plate thickness of 0.08mm (JIS C1700) was used for the female contact 2, while molten-metal quenching ribbon materials of Cu-Al-Ni alloy and Ni-Ti alloy indicated in the foregoing table were used for the shape memory alloys. The quenched materials were prepared by a two-roll quenching apparatus, and were thin plates of 0.06-0.09 mm thick and 5-10mm wide. As manufacturing conditions, a nozzle made of silica and provided with a round port having a diameter of 0.8-1.0 mm was used, and a molten metal was spurted between rolls of Cu-Be (diameter: 120mm) at a peripheral speed of about 10m/s by Ar gas of pressure (pressure: 1.0-1.5 kg/cm$^2$), thereby to be quenched and solidified. Various characteristics in the table were measured at the room temperature.

FIGS. 4(a)-4(d) show plan views of four sorts of plane shapes of the female contactors 2 whose contours were worked circular from the alloy thin plates, with FIG. 4(a) and 4(b) corresponding to cases where the sections of the male contacts are circular, and FIGS. 4(c) and 4(d) cases where the male contacts are rectangular. As the workings, electrospark machining with a wire, chemical etching and punching were tried. In the electrospark machining with the wire, a hole for passing the wire was first drilled. The drill could work a diameter of 0.1 mm at the minimum. Used as the wire was a copper wire having a diameter of 0.1 mm at a minimum or a tungsten wire having a diameter of 0.05 mm. As a result, the width of a slit 7 was possible down to 0.1 mm. In addition, in the chemical etching, a slit shape printed on a photographic film was placed on a ribbon whose surface was coated with a photo-hardening resin, the ribbon was exposed to light, and only the unexposed region of the surface corresponding to the slit portion was washed out. As a result, the ribbon fell into the state in which only the slit portion was not covered with the resin. This ribbon was immersed in a solution of ferric chloride for etching. Then, the width of the slit 7 could also be worked down to 0.1 mm. The punching was performed in a state in which the clearance was zero, by the use of a metal mold made of a die steel SKD11. Also with this method, the slit width could be worked to 0.1 mm at the minimum.

Pins were inserted into the female contacts 2 thus worked, and joining forces were assessed. Regarding the shapes of the female contacts, the slit 7 had a length of 3 mm and a width of 0.2 mm and a central hole part 5 had a diameter of 0.5 mm in the cases of FIGS. 4(a) and 4(b) and a rectangle at one side of 3 mm and a slit 7 had a width of 0.2 mm in FIGS. 4(c) and 4(d) ( in the case of FIG. 4(d), the length of the middle slit 7 was 1.5 mm). As the shape of the pins, a rod-like pin 0.8 mm in diameter was used for the former female contacts 2 in FIG. 4(a) and FIG. 4(b), and a rod-like pin of a rectangle of 0.4 mm x 1 mm for the latter female contacts 2 in FIG. 4(c) and 4(d). The female contacts 2 were subjected to shape memory so as to be flatten in the operating state, and the pins were inserted in liquid nitrogen. After the aforementioned Cu- 14wt% Al - 4wt% Ni alloy thin plate formed with the slits was deformed in the liquid nitrogen, the shape recovery, based on the shape memory effect with the rise of temperature, was continuously observed by the use of an optical microscope. The alloy thin plate was deformed into the open state as shown in FIG. 3(b) by a pin having a diameter of 1.5 mm in the liquid nitrogen, whereupon it was restored into the condition of the room temperature. Then, the shape of the room temperature was recovered substantially perfectly. When the pins 1 and the female contacts 2 were joined under the conditions as described above, the pulling forces were 200 gr in FIG. 4(a) and FIG. 4(b) and 150 gr in FIG. (c) and FIG. 4(d). As to these forces, no considerable differences were noted depending upon the materials. The contact resistance at the pin contact part was 10 m$\Omega$ or above.

Figure 5B:
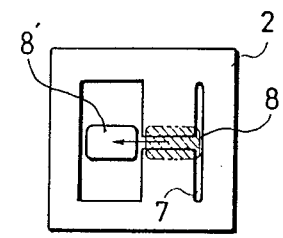
Figure 6:
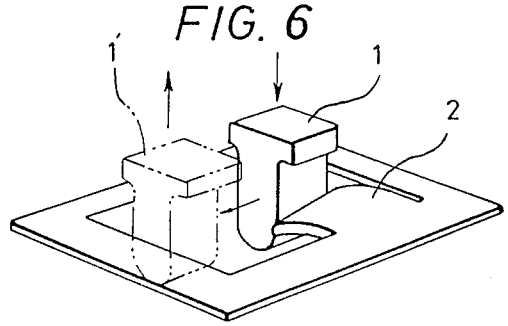
FIG. 6 is a perspective view showing the states of insertion and withdrawal between the female contact and the male contact in FIG. 5(b)

FIGS. 5(a)-5(b) provide illustrations of plane shapes of slits in structure in which pin connectors joined can be pulled out easily, with FIG. 5(a) showing a sectoral slit 7 into which three slits 7 in FIG. 4(b) are turned, and FIG. 5(b) showing a shape in which the lower half of the rectangle in FIG. 4(c) has been removed. The pin is inserted into a hatched part 8 in each figure, while it is drawn out by sliding it in a direction of the arrow and thus releasing it from the joined state. The shape of (b) is cubicly shown in FIG. 6. The force of the slide is about 1/10 of the joint force, and the pin can be readily pulled out. Moreover, in a case where the pin is immersed in the female contact 2, made of a shape memory alloy at the liquid nitrogen temperature, the material of the female contact 2 becomes soft. It was therefore possible to slide the pin with a force of about 1/50 or less.

It was attempted to insert and pull out pins on the basis of the bi-directional shape memorizing effect in the case of applying the shape memory alloy to the female contacts. Slit shapes were those shown in FIGS. 4 (a) and (c). For bi-directional shape memory, the pin of 2mm in diameter or having a rectangle of 1.2×1 mm was first inserted at the liquid nitrogen temperature so as to be worked intensely. This step was repeated 2-3 times for the shape memory. The pin of the above condition was inserted into the female contact 2. Then, since a gap was formed between the pin and the joining part at the insertion or withdrawing stage, no force was necessary for the operation. It has been found that the connector in the joined state can endure up to a pulling-out force of 150 gr, and it has been acknowledged that a connector of low insertion force can be provided.

Figure 7A:
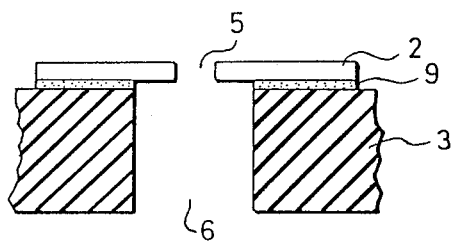
FIGS. 7(a)-7(b) are cross-sectional views of connector components illustrative of other examples of the present invention in each of which a female contact is formed at an insulating substrate.
Figure 7B:
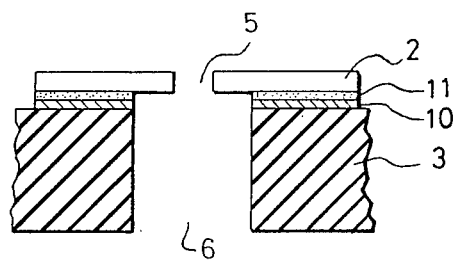

A method for fixing the female contact 2, described above, to a substrate having a pin inserting hole was studied, with the materials of the female contacts 2 being the same as described above, and a glass epoxy resin, an epoxy resin and an alumina plate were used as the substrate materials. The working of the holes of these substrates was carried out with a conventional drill for the former and with a $CO_2$ laser for the latter. First, a fixing method by bonding was studied. FIG. 7(a) illustrates a method in which the female contact is fixed on the substrate simply by an adhesive 9. In generally, any adhesive may be used as long as the bonding strength is sufficient. However, when the shape memory alloy is used, the adhesive must endure the heat cycle from the room temperature to the liquid nitrogen temperature. Ordinary organic adhesives cannot endure this cycle; however, for example, an inorganic adhesive of alumina or zirconia and water glass can endure the cycle. Further, when dried sufficiently, a silver paste afforded a satisfactory bonding strength of about 150 gr in terms of the stripping strength. In case of the alumina substrate, when the bonded structure is baked at 500°-600° C. for 1 h, the bonding strength is enhanced more by about 50%. FIG. 7(b) illustrates a method in which, for bonding enduring the heat cycle, a ceramics substrate is metallized and is provided with a plating layer 10, whereupon the female contact is bonded by the use of a brazing material 11. In this example, the substrate was metallized with an Mo-Mn paste at 1100° C. for 1 h and was subjected to Ni plating, whereupon the female contactor was bonded with a silver solder. Both the alloys attained good bonding of at least 300 gr in terms of the stripping strength.

Figure 8A:
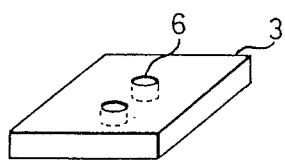
FIGS. 8(a)-8(d) are perspective views illustrative of a manufacturing process in which the female contacts of the present invention are unitarily formed by bonding and chemical etching.
Figure 8B:
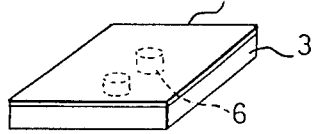
Figure 8C:
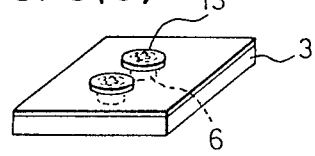
Figure 8D:
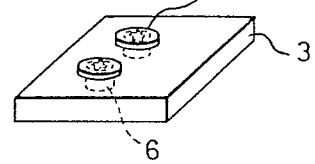

Using the above described brazing bonding and the chemical etching, it was tried to directly form female contacts in hole portions on a substrate having the pin inserting holes. Used as the brazing materials were an indium solder, a silver solder, a lead solder, etc. FIG. 8(a) shows an alumina substrate 3 provided with holes 6, with FIG. 8(b) showing a thin plate 12 of a Cu - 14wt-% Al - 4wt-% Ni alloy to form female contacts bonded on the substrate 3 by the brazing. As shown in FIG. 8(c), the thin plate was etched by the chemical etching so that the parts to form the female contacts might be left around the holes 1. Under this state, masking was further changed, and the slits of the pin joining parts were formed by etching. Since this process is possible, it has been found that a large number of female contacts corresponding to a large number of pins can be manufactured at one time.

Figure 9A:
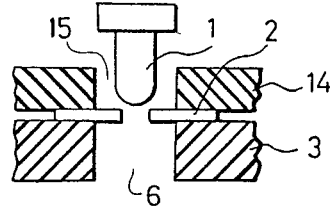
FIGS. 9(a)-9(c) are sectional views of the connector components of the present invention in each of which a female contact is held between insulating substrates.
Figure 9B:
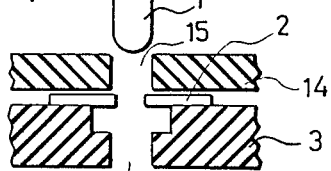
Figure 9C:
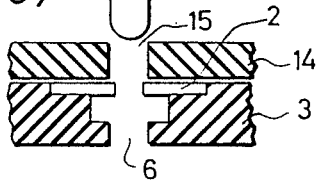
Figure 10:
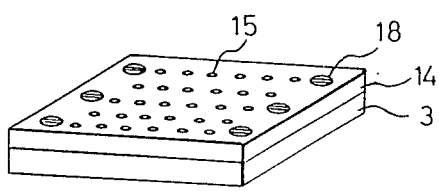
FIGS. 10 and 11 are perspective views showing multi-pin connector structures.
Figure 11:
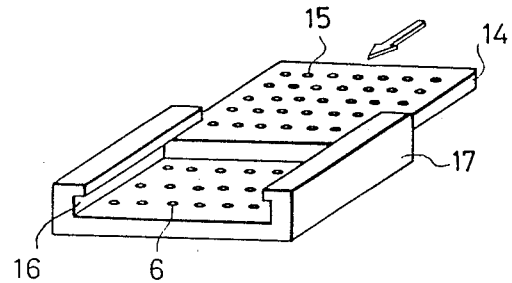

As another example of the fixing method, a female contact was interposed between two substrates 3 and 14 as shown in FIGS. 9(a)-9(c). FIG. 9(a) shows a case where the diameters of the pin inserting holes 15 in the upper and lower substrates are equal, FIG. 9(b) a case where upper and lower holes have diameters somewhat larger than the diameter of a pin and function as the guide of the pin, and FIG. 9(c) a case where, in order to bring the upper and lower substrates into perfect adhesion, the lower substrate is provided with a groove, in which the female contact is arranged. These are somewhat complicated in structure as compared with the bonding method, but are high in the reliability of fixation. In addition, after the female contact was simply bonded as shown in FIG. 7(a), it had the substrate applied from above into the sandwiched structure, whereby fixation enduring even the heat cycle was realized. Perspective views of pin connectors applying this fixation system are shown in FIG. 10 and 11, with FIG. 10 adopts the system of FIG. 9 (b) and FIG. 11 adopting the system of FIG. 9(c). In FIG. 10, thirty pins are provided at a pitch interval between the pins of two inches. The pin is circular and 0.8 mm in diameter, and the slit shape of the female contactor is that of FIG. 4(b) having a length of 3 mm. The substrates are of an acrylic resin. While in FIG. 10 the substrates are fixed by screws 18, in FIG. 11 guide slots 16 are provided for inserting and fixing the upper substrate 14 between both the ends of the lower substrate 17, and the upper substrate is inserted laterally as indicated by arrow. In the case of FIG. 10, the female contacts need to be fixed on the lower substrate by simply bonding in order to fix their positions; whereas, in FIG. 11, the positions are fixed merely by placing the female contacts on the groove of the lower substrate. This brings forth the advantage that, even when the joining part of only one pin has a drawback such as damage, the female contacts can be immediately exchanged.

In another embodiment, a Cu-Ni-Al-system shape memory alloy was deposited and compounded on Cu and Al foils placed on various insulating substrates having pin insertion holes, by sputtering. Oxygen-free copper (JIS, first class), electrolytic Ni (purity: 99.5%) and Al (purity: 99.8%) were mixed, and one charge of 2.5 kg was dissolved at a high frequency in vacuum ($10^{-5} - 10^{-4}$ Torr). It was cast in a metal mold having a diameter of 95 mm. Discs 90 mm in diameter and 5 mm in thickness were cut out of a produced ingot by machining, and were used as sputtering targets. Sputtering equipment, of the bipolar DC - magnetron type was employed and, after the interior of a vessel in the equipment was evacuated to $3 \times 10^{-7}$ Torr, Ar was introduced up to a pressure of 30 mHg, and the alloy was deposited on one side of a Cu foil or Al foil (20μm thick) under the sputtering conditions of an inter-electrode distance of 60 mm, and Ar partial pressure of $5 \times 10^{-3}$ Torr and an electric power of 200 W. The sputtering time-dependency of the thickness of a sputtered film at the time at which the alloy was deposited on the substrate increased substantially rectilinearly with time. The alloy could be deposited near to 50 μm in 4.5 h, and was in favorable close contact with the Al foil even in the deposited state left intact. On the Cu foils, substantially the same time-dependency of the thickness of the sputtered film and films of high adhesion were attained. The martensitic transformation starting temperature ($M_s$) of these sputtered films was −123° C. as a result of the four-terminal measurement of an electric resistance. Accordingly, the shape memory alloy exhibits a remarkable shape memory effect between liquid nitrogen and room temperatures, and it can be employed for a member which is operated between the temperatures.

When the quenched structure was observed with a scanning electron microscope, a layer of very fine crystals of about 2-3μm in diameter was formed at the surface and moderated the stress concentration on a grain boundary against a bending deformation, so that the bending ductility was enhanced.

Using the substrates in which the shape memory alloy was deposited on the Al and Cu foils in this manner, female contacts were manufactured by the process based on the chemical etching as shown in FIGS. 9(a)-9(c). A good shape memory effect was noted when the shape memory alloy was deposited to thicknesses of at least about 2μm in the composite material with the Al foils being 50μm thick and to a thickness of at least about 4μm in the composite material with the Cu foils. IN addition, the composite materials in which both the constituents were in close contact with each other were formed.

In the present embodiment, a female contact which was 1mm in the outside diameter, 0.5 mm in the diameter of the central hole portion 5, and 3 mm and 0.2 mm in the length and width of the slit y, respectively, was produced by chemical etching. A pin having a diameter of 0.8 mm was inserted therein in liquid nitrogen, to perform the intense working of bending in which the central hole part 5 was opened more. Subsequently, the connector was restored to the room temperature. Then, it was confirmed that the contact part of the female contact returned into the original flat state. Next, the female contact was put in the liquid nitrogen again, and the pin was similarly inserted. Then, the pin could be inserted with quite no resistance. When the pin was drawn out at the room temperature, the drawing out force was 100 gr. Therefore, a connector of zero insertion force is provided.

Figure 12:
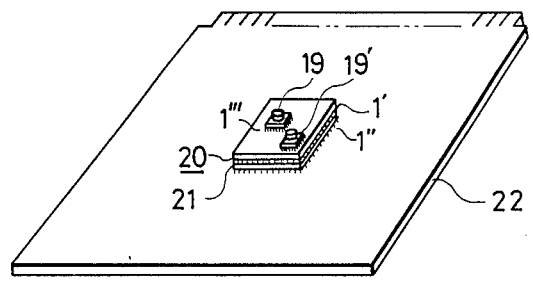
FIG. 12 is a perspective view showing LSI packaging which uses the connector of the present invention.

FIG. 12 provides an exemplary application to the packaging of an LSI wherein a printed circuit board 22 has installed thereon LSI packages 19, 19' employing the electric connector of the present invention is installed. The LSIs 19, 19 are soldered to a ceramic multi-layer print-wired substrate 20, and are further connected to the connector 21 of the present invention. The connector of the present invention is joined to a printed circuit board 22 by solder 25.

Figure 13:
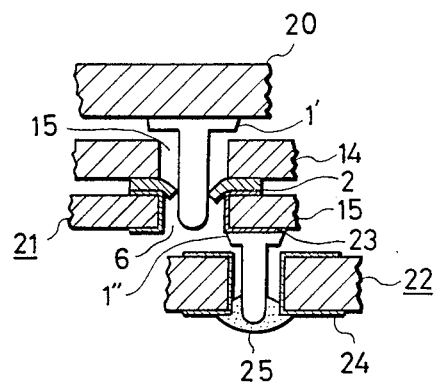
FIGS. 13-16 are cross-sectional views of similar applications of the electric connectors of the present invention to LSI packaging.

FIG. 13 is a set up view of a section of the state in which the connector of the present invention is placed on a printed circuit board 22, and the multi-layer print-wired substrate is placed on the connector. In the connector of the present invention, a conductive film 23, which electrically connects a female contact 2 and a pin 1'' inserted in the printed circuit board 22, is provided on a hole part 6 for inserting the pin 1 of a ceramic insulating substrate 15, and the female contact 2, made of a shape memory alloy, is fixed on the conductive film 23 by an upper ceramic insulating substrate 14. The female contacts 2 of the present invention are such that a thin film is formed by molten-metal quenching, evaporation, sputtering or the like as described before, in that the thin film deposited on the insulating substrate is etched into a predetermined shape as described before.

Figure 14:
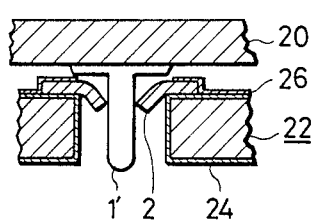

In FIG. 14, the female contacts 2 of the present invention is formed on the printed circuit board 22, and the multi-layer print-wired substrate 20 is placed thereon. The printed circuit board 22 is formed with wiring leads by an ordinary method, and the female contact 2 made of a shape memory alloy is formed on the whole part thereof for inserting a pin 1' similarly to the foregoing. A wiring film 24 and the female contact 2 are joined by a conductive paste or the like. The female contact 2 is coated with a resin 26. In both FIGS. 13 and 14, the pins 1' can be inserted with low insertion forces because the insertion is performed in the soft martensite state.

In order to form the female contacts 2 in the vapor phase by sputtering, evaporation or the like in the case of FIG. 13 or 14, the pin inserting holes need to be closed. Therefore, a metal foil is adhered to the insulating substrate 3 of the printed circuit board 22, and the shape memory alloy is formed thereon and is etched into the desired shape.

Figure 15:
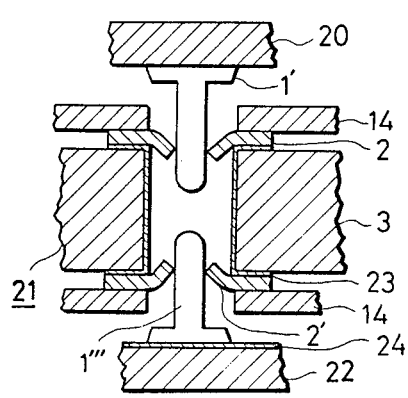

FIG. 15 provides another example of the electric connector of the present invention which is also suited to the packaging of an LSI. Structurally, female contacts 2, 2' made of a shape memory alloy, are disposed on both the surfaces of an insulating substrate 3. A conductive film 23 is provided so that the female contacts 2, 2' may be electrically connected with each other. A pin 1' disposed on a multi-layer print-wired substrate 20 is inserted in the female contact 2, while a pin 1''', disposed on a printed circuit board 22 is inserted in the female contact 2 . Thin films to construct the female contacts 2, 2' can be manufactured by various methods as described before. In order to form the shape memory alloy in the vapor phase by sputtering, evaporation or the like, the pin inserting holes may be closed up with metal foils as described above.

According to the present invention, pins can be inserted with a low insertion force by subjecting the female contacts to shape memory so as to widely expand the spaces of the hole parts thereof in the soft martensite state or at a low temperature. Moreover, the female contacts can be produced by the etching technique. It is therefore possible to provide an electric connector which can be miniaturized and which has a high productivity due to a unitary forming.

Figure 16:
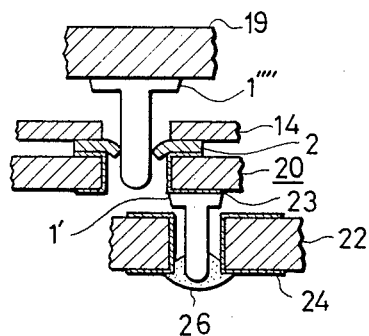

In an LSI packaging structure of FIG. 16, a multilayer print-wired substrate 20 is provided with a female contact 2 of the present invention employing a shape memory alloy. As in the foregoing, the female contact 2 of a thin film can be formed on the multi-layer print-wired substrate 20 by the use of a thin ribbon produced by melting and quenching the shape memorizing alloy. Alternatively, the thin film is directly formed on the multi-layer print-wired substrate fabricated by an ordinary method, in electrical connection therewith by a process for the formation in the vapor phase such as evaporation or sputtering, whereupon it is formed into a desired shape by the etching technique.

In accordance with a further embodiment of the present invention, a Cu-Ni-Al- system shape memory alloy was deposited and compounded on various substrates (Cu, Al) by sputtering. The alloy had a composition of Cu-4%-Ni-14%-Al (by weight). Oxygen-free copper (JIS, first class), electrolytic Ni (purity 99.5%) and Al (purity: 99.8%) were mixed, and one charge of 2.5Kg was dissolved at a high frequency in a vacuum ($10^{-5}-10^{-4}$Torr). It was cast in a metal mold having a diameter of 95 mm. Discs 90mm in diameter and 5 mm in thickness were cut out of a produced ingot by machining, and were used as sputtering targets. Sputtering equipment, of the bipolar DC magnetron type, was employed and, after the interior of the vessel in the equipment was evacuated to $3\times10^{-7}$ Torr, Ar was introduced up to a pressure of 30mHg, and the alloy was deposited on one side of the Cu foil or Al foil (20μm thick) under the sputtering conditions of an electroload distance of 60 mm, and Ar partial pressure of $10^{-2}$ Torr and an electric power of 200W.

The alloy was deposited on the substrate made of the Al foil, by sputtering. The thickness of the shape memory alloy film increases substantially rectilinearly with the sputtering time. The alloy can be deposited near to 50μm in 4.5h., and is in favorable close contact with the Al foil even in the deposited state left in tact. On the Cu foils, substantially the same time-dependency of the thickness of the sputtered film and films of high adhesion were attained. The martensitic transformation starting temperature (Ns) of these sputtered films was −123° C. as the result of the four terminal measurement of an electric resistance. Accordingly, the shape memory alloy exhibits a remarkable shape memory effect between liquid nitrogen and room temperature, and it can be employed for a member which is operated between the temperatures. When the quenched structure was observed with a scanning electron microscope, a layer of very fine crystals about 2-3μm in diameter was formed at the surface and moderated the stress concentration on a grain boundary against a bending deformation, so that the bending ductility was enhanced.

Test pieces each being 5 mm and 50 mm long were cut out of the composite materials in which the alloy was sputtered and deposited on the Al and Cu foils to various thicknesses in this manner, and the presence or absence of the phenomenon of the shape memory effect therein was examined. In the shape memory alloy film, the state formed by the sputtering is stored. Accordingly, a desired shape can be stored in conformity with the shape of the film. The test piece was bent to a radius of 3 mm so that the side of the shape memory alloy film might be subjected to a tensile stress. In that state, the test piece was immersed in liquid nitrogen and plastically deformed. Thereafter, the test piece was returned to the room temperature, and the shape recovery state thereof was examined. As a result, good shape recovery was noted when the shape memorizing alloy was deposited to thickness of at least about 2μm in the composite material with the Al foils being 50μm thick and to thicknesses of at least about 4μm in the composite material with the Cu foils. Thus, according to the present example, the sputter-deposited shape memory alloy favorably adhered to the substrates, and the composite materials exhibited good shape memory effects. When female contacts having the shape in FIG. 5(a) were formed by electrospark machining, chemical etching and punching by the use of these composite materials, favorable shape memory effects were attained.

Figure 17:
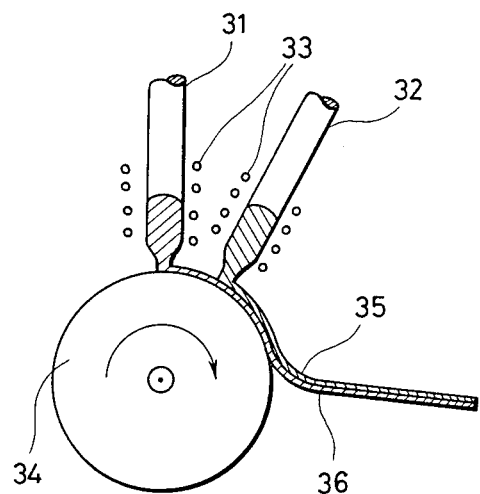
FIG. 17 is a schematic view of a molten metal quenching apparatus for producing the shape memory composite material of the present invention.

A shape memorizing composite material was produced by compounding Cu and Cu-based shape memorizing alloy by the use of a method of quenching molten metals as shown in FIG. 17. The Cu was inserted in a nozzle 31, and the Cu-4wt% Ni-14dwt% Al alloy in the nozzle 32, and they were molten by a high frequency coil 33. Using argon gas under a high pressure, the molten metals were spurted on a row 4 rotating at high speed, to be quenched and solidified. A composite ribbon of the Cu and the shape memory alloy, in which the Cu-based shape memory alloy was deposited on a Cu ribbon, was fabricated by this method. The nozzles 31 and 32 were made of transparent silica. At the tips, the nozzle 31 was provided with a slit of 0.5×5 mm, and the nozzle 32 with an aperture of 0.5 mm in diameter. The distance between the two nozzles was set at 120 mm. Oxygen-free copper (JIS first class) was employed at the Cu. The roll used was made of tool steel and had a diameter of 300 mm, and was set at a rotational frequency of 2,000 rpm. The gap between each nozzle and the roll was set at 0.02 mm, and the molten metals spurted under a jet gas pressure of 0.4 kg/cm². In the composite material, Cu was 50μm thick, and Cu-Al-Ni was 90μm thick, and they adhered favorably. When the shape memory effect was assessed by the method in accordance with the previously described embodiment, good shape recovery was noted. The boundary between the compounded ribbons could not be observed because of the absence of any means for detecting the alloy phase. However, the atoms were physically joined in close contact with each other so as to have a force enough to endure a bimetal-like action. Further, when female contacts having the shape in FIG. 5(a) were formed by electrospark machining etc., favorable connections as connectors were achieved.

We claim:

1. A connector comprising:
    a first insulating substrate having a plurality of through-holes and having a first circuit pattern formed on the insulating substrate;
    female contacts of a thickness not more than 100μm, each of said female contacts being formed and fixed around the edge of the through-hole of said first insulating substrate and having an opening, an edge of which extends inwardly of the through-hole of said first insulating substrate, the female contacts being electrically connected to the first circuit pattern of said insulating substrate;
    a male contact comprising a second insulating substrate having a second circuit pattern thereon and a plurality of male contact pins fixed to the second insulating substrate and electrically connected to the second circuit pattern, the male contact pins each being located in a position corresponding to each of the openings of said female contacts,
    said female contacts are made of a shape memory alloy and the edge of each of the female contacts is given, prior to insertion of each of the male contact pins, a shape memory such that said female contact is returned to a position to close the opening when said female contact is subjected to a temperature above the finishing temperature of the transformation from martensite to parent phase, and
    said male contact is inserted in the opening of said female contact at a temperature not higher than the starting temperature of the transformation from parent phase to martensite of the shape memory alloy of said female contact, whereupon said female contact is maintained at a temperature over the finishing temperature of the transformation from martensite to parent phase of the shape memory alloy, and
    wherein said female contacts, of the shape memory alloy, are made of a flat thin film and are arranged orthogonally to a direction of the insertion of the male contact, whereby said female contact and said male contact are electrically connected and are mechanically joined securely with each other in a service temperature, whereupon the connector is held over the finishing temperature of the transformation from martensite to parent phase in the service temperature.

2. A connector as defined in claim 1, wherein the part of said female contact forming the opening has shape memory based on a bending deformation so as to bending deformed into a space larger than an occupying space of said male contact in the contact part between said female contact and male contact in the temperature condition not higher than the starting temperature of the transformation from parent phase to martensite of the shape memory alloy, and so as to become a space smaller than the occupying space of said male contact in the contact part in the finishing temperature of the transformation from martensite to parent phase condition after the male contact has been inserted in the bending-transformed stage.

3. A connected as defined in one of claims 1 or 2, wherein said female contacts are formed of a composite member in which flat thin metal films are deposited and adhered, and at least one of the flat thin metal films is made of the shape memory alloy.

4. In a packaging structure for a semiconductor device wherein a multilayer print-wired substrate on which the semiconductor device is mounted is connected to a connector, and the connector is then mounted on a printed circuit board; a connector comprising:
    a first insulating substrate having a plurality of through-holes and having a first circuit pattern formed on the first insulating substrate;
    female contacts each being formed and fixed around the edge of the through-hole of said first insulating substrate and having an opening, an edge of which extends inwardly of the through-hole of said first insulating substrate, the female contact being electrically connected to the first circuit pattern of said first insulating substrate;
    a male contact disposed in the multilayer print-wired substrate and comprising a second insulating substrate having a second circuit pattern thereon and a plurality of male contact pins fixed to the second insulating substrate and electrically connected to the second circuit pattern, the male contact pins each being located in a position corresponding to each of the openings of said female contacts;
    said female contacts are made of a shape memory alloy and the edge of each of said female contacts is given, prior to insertion of each of the male contact pins, such a shape memory that said female contact is returned to a position to close the opening when said female contact is subjected to a temperature above the finishing temperature of the transformation from martensite to parent phase;
    said male contact is inserted in the opening of said female contact at a temperature not higher than the starting temperature of the transformation from parent phase to martensite of the shape memory alloy of the female contact, whereupon said female contact is maintained at a temperature over the finishing temperature of the transformation from martensite to parent phase of the shape memory alloy;
    said female contacts, of the shape memory alloy, are made of a flat thin film having a thickness of 100μm and are arranged orthogonally to the direction of insertion of said male contact, whereby said female contacts and said male contact are electrically connected and are mechanically joined securely with each other in a service temperature, whereupon the connector is held over the finishing temperature of the transformation from martensite to parent phase in the service temperature.

5. A packaging structure for a semiconductor device as defined in claim 4 wherein said female contacts are formed of a composite member in which thin metal films are deposited and adhered, and at least one of the flat thin metal films is made of the shape memory alloy.

6. A connector as defined in claim 1, wherein the shape memory alloy of said female contact is quenched in a vapor or a liquid phase.

7. A packaging structure for a semiconductor device as defined in one of claims 4 or 5, wherein the shape memory alloy of the female contact is quenched in a vapor phase or a liquid phase.

8. A connector as defined in claim 3, wherein the composite member is made by a rapid melt-quenching method.

9. A packaging structure for a semiconductor device as defined in claim 5, wherein the composite member is made by a rapid melt-quenching method.

10. A connector as defined in claim 1, wherein a length of the opening of said female contact is comparatively longer than a diameter of said male contact.

11. A connector as defined in claim 1, wherein said female contact has another opening for withdrawal, the withdrawal opening of the female contact is communicated with the opening of said female contact so as to enable a withdrawal of said male contact from the withdrawal opening of said female contact.

12. A connector as defined in claim 1, wherein said male contact and said female contact are loaded with a joined force, and when the joined made and female contacts are cooled to a condition of or below the starting temperature of transformation from parent phase to martensite of the shape memory alloy, the opening of said female contact opens so as to withdraw said male contact from the opening of said female contact.

* * * * *